United States Patent [19]

DerMarderosian, Jr.

[11] Patent Number: 5,076,906

[45] Date of Patent: Dec. 31, 1991

[54] METHOD FOR TESTING ENCAPSULATION INTEGRITY

[75] Inventor: Aaron C. DerMarderosian, Jr., Lexington, Mass.

[73] Assignee: Raytheon Company, Lexington, Mass.

[21] Appl. No.: 648,703

[22] Filed: Jan. 31, 1991

[51] Int. Cl.⁵ ............................................. G01N 27/26
[52] U.S. Cl. .................................. 204/153.1; 204/401
[58] Field of Search ............................. 204/153.1, 401

[56] References Cited

U.S. PATENT DOCUMENTS

| | | | |
|---|---|---|---|
| 3,408,270 | 10/1968 | Gentile | 204/153.1 |
| 3,494,837 | 10/1966 | Messner et al. | 204/153.1 |
| 4,514,436 | 4/1985 | Moerschel | 204/153.1 |
| 4,919,766 | 4/1990 | Kotowski et al. | 204/153.1 |
| 4,981,567 | 1/1991 | Wolcott | 204/153.1 |

Primary Examiner—John Niebling
Assistant Examiner—Bruce F. Bell
Attorney, Agent, or Firm—Christopher L. Maginniss; Richard M. Sharkansky

[57] ABSTRACT

A procedure is disclosed for detecting and documenting flaws in the glassivation layer protecting the active device region of an integrated circuit. A droplet of dilute sulfuric acid solution is placed on top of the glassivation layer and a positively biased electrode is immersed in it. The leads coupled to circuit under the glassivation layer are coupled to a more negative voltage. The release of hydrogen bubbles into the solution through flaws in the glassivation via an electrolysis reaction are readily observable. Defects in a glassivation layer over nichrome devices may be documented by reversing the polarity of the bias to cause a reversal of the electrolysis process and a release of oxygen from the defective sites. This causes oxidation and disfigurement of the nichrome which can be documented using ordinary photographic means. Defects in a glassivation layer over aluminum may be documented by replacing the droplet of dilute sulfuric acid with a droplet of dilute sodium chloride; the resulting disfigurement may be photographed.

15 Claims, 3 Drawing Sheets

METHOD FOR TESTING ENCAPSULATION INTEGRITY

The Government has rights in this invention pursuant to Contract No. N00030-88-C-0054, awarded by the Department of the Navy.

BACKGROUND OF THE INVENTION

The present invention relates generally to microelectronics circuits packaging and, more particularly, to a method for testing the integrity of the protective encapsulation of such packages.

Glassivation is a process by which a protective layer of a glass-like substance is coated over the die surface of an integrated circuit (IC). One purpose of this protective layer is to safeguard the active circuitry thereunder from conductive particles, contaminants or the corrosive effects of water vapor. The presence of any one of these impurities may significantly affect the electrical characteristics of the circuit.

In the past, it was observed that the failure of many integrated circuits was due to corrosion of the thin film nichrome resistors or to corrosion of the aluminum used in the metallization layer for interconnects. The cause of this corrosion was traced to inadequate glassivation or defects therein, and to the resulting moisture trapped within the package cavity. The solution to this failure problem was to improve the glassivation layer and to develop quality assurance testing to check the integrity of this layer. The currently used testing methods, such as nichrome and aluminum metal etch tests, which are described in greater detail in later paragraphs, are somewhat ambiguous in the fault detection process, relatively expensive to perform, time-consuming and, without proper handling, potentially hazardous to the health of the test operator.

The currently used glassivation integrity test procedure requires two acid-based etching solutions. A first solution, used for etching aluminum metal, comprises phosphoric acid (80% by volume), nitric acid (5%), acetic acid (5%) and deionized water (10%). The second solution, used for etching nichrome, comprises ceric sulfate (6 grams per 100 ml of solution), nitric acid (10% by volume) and deionized water (90%). Both solutions must be heated so that the etching process will occur at an increased rate, and the nichrome-etching solution must be constantly stirred to keep it well mixed. These solutions are relatively expensive, they require careful handling during use, and they must be disposed of in accordance with standards for hazardous waste material.

In accordance with a currently used test procedure, the part to be tested is inspected under a high-powered microscope for any gross mechanical damage. The part is then dipped into a heated acid solution, as described above, for a minimum of 15 seconds. The part is then thoroughly cleaned and dried, and again is inspected carefully under the high-powered microscope. In accordance with a capillary wicking effect, the acid will seep into any pinholes or cracks that exist in the glassivation layer, and corrode or dissolve any exposed circuitry, leaving a void which is visible under a high-powered microscope. Visible voids may then be photographed for permanent documentation. The capillary wicking effect is dependent on the surface tension of the applied liquid and the width of the crack. Heating of the acid solution does not significantly influence capillary wicking.

When etching of the metallization occurs as a result of a defect in the glassivation layer, there are two types of oxidation which can take place in the defective area. The first and most common reaction occurs when the acid enters the defective area and oxidizes the metal region it contacts. The by-product of this reaction exits through the defective region and flows out into the acid solution, thereby adding contaminants to the testing solution.

The second type of reaction is a limited diffused reaction. This is caused primarily by the shape of the void and the type of chemical reaction which occurs when the acid is exposed to metallization. The oxidation by-product is trapped in the void, resulting in a build-up which covers up the defective region. This results in a healing process in which the acid solution can no longer contact the defective area, thereby stopping the etching process. This type of by-product will appear as foreign material and can easily be misidentified as such during inspection, thereby imparting ambiguous results to the glassivation integrity test. This limited diffused reaction case is not encountered frequently; however, it is difficult to identify due to its appearance and lack of obvious voiding.

In view of the above, it is clear that there exists a pressing need to develop an encapsulation integrity test which avoids many or all of the disadvantages associated with the currently used process.

SUMMARY OF THE INVENTION

It is therefore a primary object of the present invention to provide a method for testing the encapsulation integrity of a microelectronics circuit package.

It is a further object of this invention to provide such a method which is an improvement over currently used techniques in that it is less time consuming, less expensive and does not involve the handling of hazardous materials.

It is a still further object of the present invention to provide such a method which detects flaws in a glassivation layer over aluminum and nichrome circuitry on a non-destructive basis.

These and other objects of this invention are obtained generally by providing a method for detecting voids in an encapsulation layer overlying an electrically conductive device. The method comprises the steps of covering the encapsulation layer with an electrolytic solution, applying an electrical potential between the electrolytic solution and the electrically conductive device, and observing the encapsulation layer for the evolution of gas bubbles through the electrolytic solution.

In a first embodiment, the device is non-destructively tested by covering the encapsulation layer with an electrolytic solution including deionized water and sulfuric acid, and applying the more positive potential to the electrolytic solution. In a second embodiment, a device including nichrome metallization is destructively tested by covering the encapsulation layer with an electrolytic solution including deionized water and sulfuric acid, and applying the more negative potential to the electrolytic solution. In a third embodiment, a device including aluminum metallization is destructively tested by covering the encapsulation layer with an electrolytic solution including deionized water and sodium chloride, and applying the more negative potential to the electrolytic solution.

With this method, it is possible to provide an encapsulation integrity test which provides advantages over the presently used method in that it is less costly, more accurate, less time consuming and does not involve the use of hazardous chemicals. The disclosed method also permits disfigurement at the defective site which is readily documented using ordinary photographic means.

BRIEF DESCRIPTION OF THE DRAWINGS

The foregoing features of the present invention, and the advantages thereof, may be fully understood from the following detailed description, read in conjunction with the accompanying drawings, wherein.

DESCRIPTION OF THE PREFERRED EMBODIMENTS

The present invention relies on the principles of electrolysis to test the encapsulation integrity of a microelectronics circuit package and to provide documentation of defects in the encapsulating layer. The theory and fundamentals of electrolysis are not new. It has been utilized for several years, and applied to many important purposes in the electronics and other industries. It is used for gold and chromium electroplating, in failure analysis tasks, and it is the fundamental principle in charging a wet cell battery.

Figure 1:
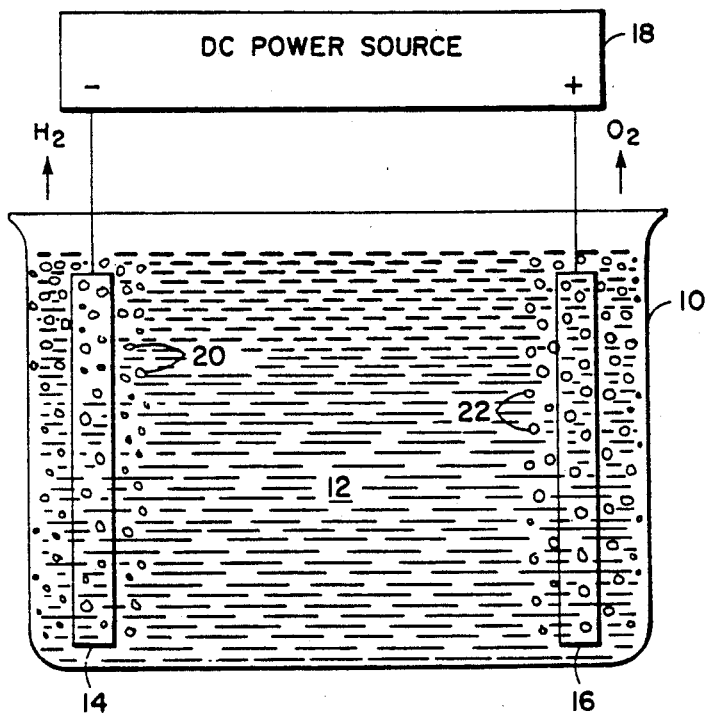
FIG. 1 illustrates apparatus used in an electrolysis reaction.

The theory of electrolysis is simple in concept. Referring to FIG. 1, electrolysis occurs when two metal or carbon rods (electrodes 14 and 16) are placed in a container 10 of tap water (electrolyte 12), and are electrically biased with a DC voltage from a power source 18. The DC electrical bias separates the hydrogen molecules in electrolyte 12 having a positive charge, and the oxygen molecules in electrolyte 12 having a negative charge. This produces a gas evolution on each of the electrodes 14 and 16, and the resultant bubbling of the hydrogen gas 20 and oxygen gas 22 up through the water 12.

Corrosion will occur on the positive electrode if it is not made of carbon or a noble metal such as pure gold. This corrosion is caused when active oxygen molecules combine and chemically react with the positively biased electrode, thereby oxidizing the exposed metal. The electrolysis reaction is expressed as follows:

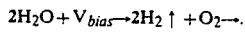

$$2H_2O + V_{bias} \rightarrow 2H_2 \uparrow + O_2 \rightarrow.$$

Figure 2:
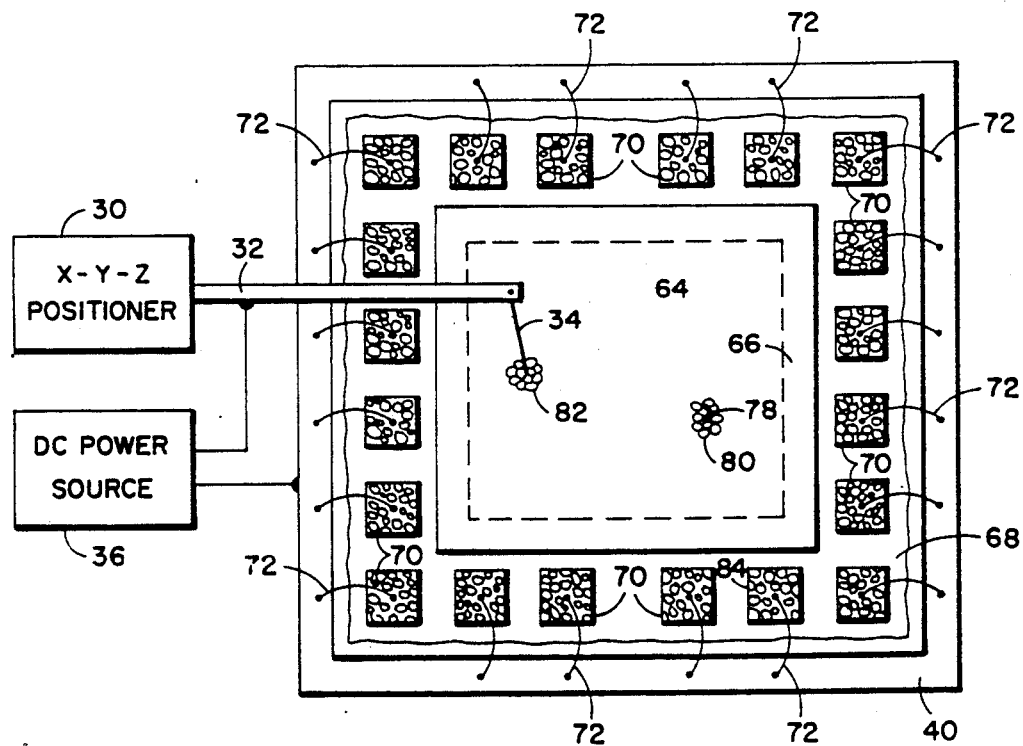
FIG. 2 is a plan view illustrating a microelectronics circuit package during testing in accordance with the principles of the present invention.

Referring to FIG. 2, there is shown a plan view illustrating a microelectronics circuit package being tested in accordance with the principles of the present invention. The testing setup includes an IC package 76 having a plurality of metal bonding pads 70, illustratively fabricated of gold, and a central region 64 including the active devices of the circuit. Central region 64 is covered by an encapsulation layer 66, which, in the disclosed embodiment, comprises a glassivation layer.

For purposes of testing, IC package 76 is placed in a test fixture 40, which provides electrical interconnection of all of the bonding pads 70, shown schematically as wire jumpers 72 in FIG. 2. A droplet 68 of a solution, to be described in detail in a subsequent discussion, which is spread across IC package 76, covers at least glassivation layer 66.

A pin probe 34, illustratively fabricated of gold, is affixed at one end thereof to the positioning arm 32 of a fine-control X-Y-Z micropositioner 30. Probe 34 is located such that its pointed tip is slightly immersed in droplet 68, without contacting glassivation layer 66. A DC power source 36 provides an electrical potential between pin probe 34 and the common connection of bonding pads 70 of IC package 76. From this generalized setup, glassivation integrity testing of IC packages including any form of metallization may be nondestructively performed. From this same generalized setup, destructive, etch-type documentation of a defective glassivation over either nichrome or aluminum metallization may also be provided. All of the processes described herein employ the principles of electrolysis.

Figure 3:
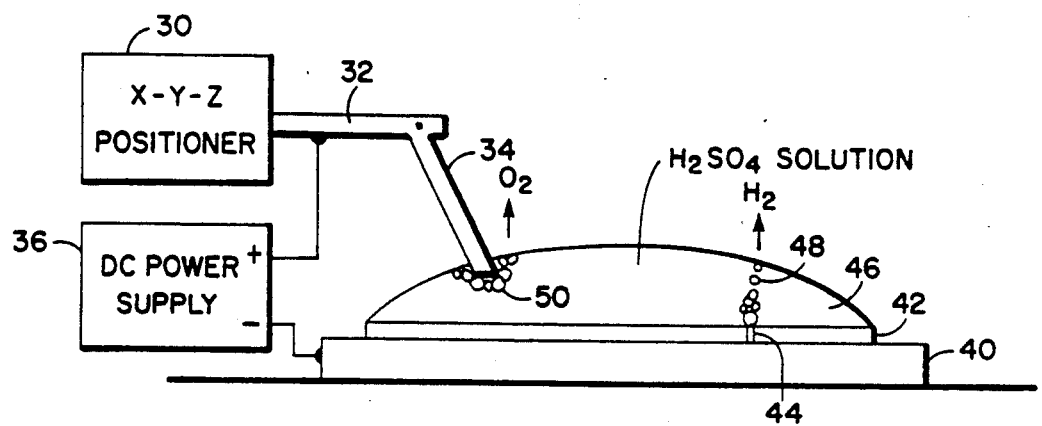
FIG. 3 illustrates a first specific test setup used in a process for testing encapsulation integrity according to the present invention.

FIG. 3 illustrates a specific test setup useful in detecting glassivation defects over any form of IC metallization. In this setup, the electrolyte droplet 46 comprises a weak solution of sulfuric acid ($H_2SO_4$), and DC power source 36 is poled so as to provide the more positive voltage at a first electrode comprising pin probe 34. With this configuration, a defect 44 within glassivation layer 42 will allow electrolyte 46 to seep into the active circuitry, causing the metallization under defect 44 to function as the second electrode. Bubbling of oxygen gas 50 will occur within electrolyte 46 in the vicinity of pin probe 34, and bubbling of hydrogen gas 48 will occur within electrolyte 46 in the vicinity of defect 44 in glassivation layer 42.

Figure 4:
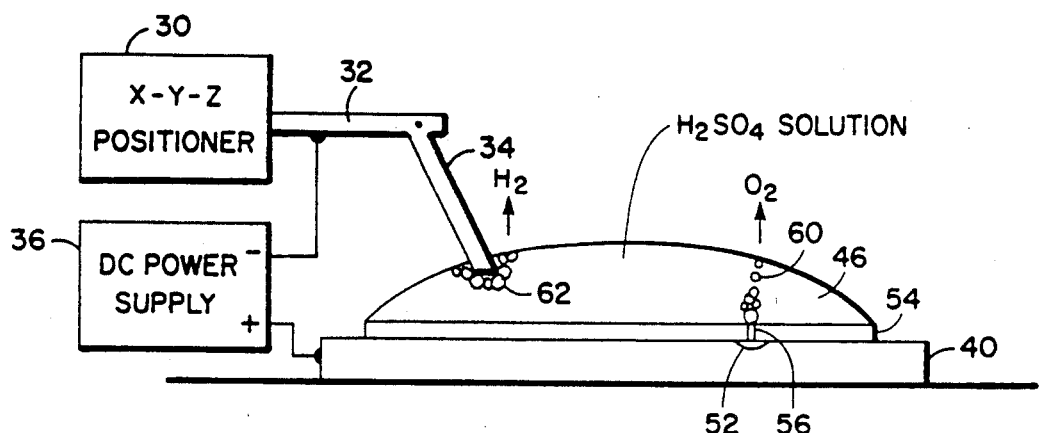
FIG. 4 illustrates a second specific test setup used in a process for documenting defects in the encapsulation over nichrome metallization.

FIG. 4 illustrates a specific test setup useful in etching nichrome metallization under a glassivation defect. As in the test setup of FIG. 3, the electrolyte droplet 46 comprises a weak solution of sulfuric acid ($H_2SO_4$), but in this etching setup, DC power source 36 is poled so as to provide the more negative voltage at the electrode comprising pin probe 34. With this configuration, a defect 56 within glassivation layer 54 will allow electrolyte 46 to seep into the active circuitry, causing the metallization under defect 56 to function as the other electrode. With this polarization of the electrodes, there will occur bubbling of hydrogen gas 62 within electrolyte 46 in the vicinity of pin probe 34, and bubbling of oxygen gas 60 within electrolyte 46 in the vicinity of defect 56 in glassivation layer 42. The presence of free oxygen will corrode the nichrome metallization under defect 56, resulting in a visible, etched-away region 52 of the metallization.

Figure 5:
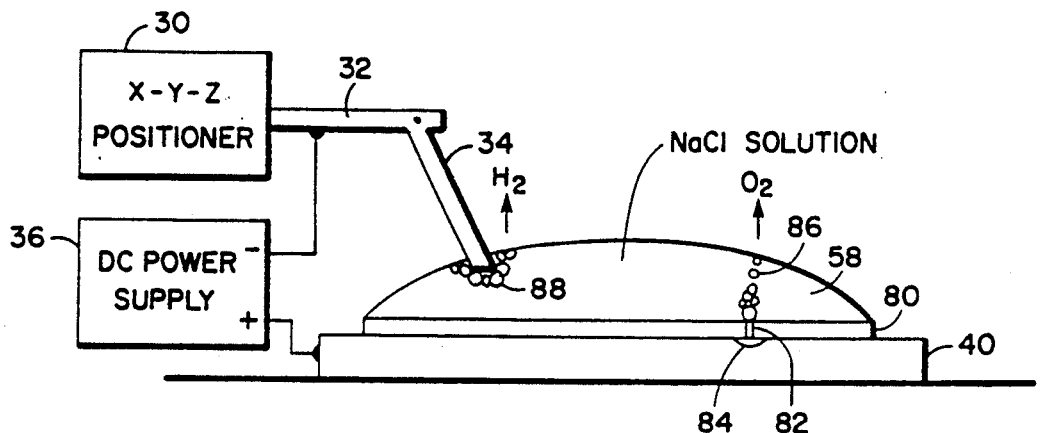
FIG. 5 illustrates a third specific test setup used in a process for documenting defects in the encapsulation over aluminum metallization.

FIG. 5 illustrates a specific test setup useful in etching aluminum metallization under a glassivation defect. In this setup, the electrolyte droplet 58 comprises a weak solution of sodium chloride (NaCl), and DC power source 36 is poled so as to provide the more negative voltage at the electrode comprising pin probe 34. With this configuration, a defect 82 within glassivation layer 80 will allow electrolyte 58 to seep into the active circuitry, causing the metallization under defect 82 to function as the other electrode. With this polarization of the electrodes, there will occur bubbling of hydrogen gas 88 within electrolyte 58 in the vicinity of pin probe 34, and bubbling of oxygen gas 86 within electrolyte 58 in the vicinity of defect 82 in glassivation layer 80. The presence of free oxygen will corrode the aluminum metallization under defect 82, resulting in a visible, etched-away region 84 of the metallization.

Solution 46 used in the defect detecting process of FIG. 3 and in the nichrome etching process of FIG. 4, preferably comprises a solution of sulfuric acid ($H_2SO_4$) (0.05% by volume) and deionized water (99.95%). The sulfuric acid is used to lower the resistance of the deionized water in the processes, and does not play any role in etching the metallization.

Solution 58 used in the aluminum etching process of FIG. 5 preferably comprises 5-10 mg of sodium chloride (NaCl) per 100 ml of deionized water. NaCl is used in this process to etch the aluminum circuitry. NaCl is particularly effective because the negatively charged chlorine atom is attracted to the positively charged circuitry, etching any exposed positively biased aluminum or nichrome. The NaCl solution is used only after a void has been detected over aluminum circuitry.

Whereas the test setup of FIG. 3 has been framed in terms of a glassivation defect detection process, and the test setups of FIGS. 4 and 5 have been framed in terms of providing etching of the circuitry underlying a glassivation defect to thereby provide visual documentation of the defect, it will be understood that the procedures described for each of these three setups may be used to detect glassivation defects. It is easily seen that the process described in relation to FIG. 3 provides non-destructive detection of glassivation defects for any type of metallization, while the processes described in relation to FIGS. 4 and 5 provide destruction detection of glassivation defects for specific types of metallization.

The chemical reactions which occur during the etching of aluminum and nichrome are complex and are detailed below. The nichrome etching process is expressed in the following balanced reaction:

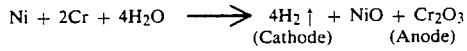
$$Ni + 2Cr + 4H_2O \longrightarrow 4H_2\uparrow + NiO + Cr_2O_3$$
(Cathode) (Anode)

In nichrome etching, the positively biased nichrome circuitry, functioning as an anode, will produce nickel oxide (NiO) and chromium oxide ($Cr_2O_3$). The negatively biased pin probe 34, functioning as a cathode, will produce hydrogen ($H_2$) gas.

There are two important chemical reactions which take place when etching aluminum circuitry. The two main by-products produced in aluminum etching are aluminum hydroxide ($Al(OH)_3$) and aluminum chloride (AlCl). The complex chemical reactions which take place are expressed in the following equations:

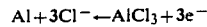
$$Al + 3Cl^- \rightarrow AlCl_3 + 3e^-$$

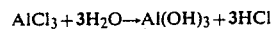
$$AlCl_3 + 3H_2O \rightarrow Al(OH)_3 + 3HCl$$

The positively biased aluminum circuitry in the presence of the NaCl solution yields aluminum hydroxide ($Al(OH)_3$), aluminum chloride (AlCl), and small amounts of hydrochloric acid (HCl). Aluminum chloride can, in turn, break down into the negatively charged chloride atom ($Cl^-$), further assisting the (NaCl) solution in the corrosion process. These charged atoms are electrically attracted to the positively biased aluminum. Therefore, the resulting corrosion is significantly enhanced by this electrical bias. The hydrochloric acid produced in this process also aids in the corrosion process. The aluminum hydroxide produced in this process does not break down.

Referring again to FIG. 2, a preferred procedure for the glassivation integrity test according to the present invention is as follows: an integrated circuit chip 76 is placed in a test fixture 74 which ties all device bonding pads 70 in common. Using a low-powered microscope, the die surface of the chip 76 is inspected for gross mechanical damage. A droplet 68 of the test solution comprising a weak solution of $H_2SO_4$ is carefully placed on the die surface, covering all active circuitry 64. A gold pin probe 34 is lowered to the surface of droplet 68 using a fine control X-Y-Z micropositioner 30. A DC power source 36 is connected to the system so that its more positive potential is applied to probe 34 and its more negative potential is applied to the electrically interconnected bonding pads 70. Power source 36 is adjusted to a maximum specified voltage. Bubbling 82 occurs in the vicinity of probe 34, and bubbling 84 occurs on the bonding pads 70 during this process. The test is complete after 15 to 20 seconds. If there is any active bubbling 80 on the glassivated surface 66, a failure 78 has been detected. If no bubbling occurs on glassivated surface 66, the glassivation layer 66 is adequately protecting the active circuitry 64.

Several experimental test procedures have been conducted to determine the voltage required to initiate detectable bubbling in a variety of IC device types. As a general rule, it was found that the electrolysis reaction provides sufficient visible indication of glassivation defects when ordinary IC devices are biased at 5 volts and when custom gate arrays are biased at 7 volts.

Documentation of failed areas on an IC can be facilitated by etching the device. For nichrome circuitry, reversing the polarity of the system and increasing the bias to approximately 10 volts for 10 to 15 seconds will adequately etch the metal. The part is now ready for high-magnification photography of the affected areas. Etching of aluminum circuitry requires the removal of the $H_2SO_4$ solution and replacement by a droplet of the NaCl solution on the die surface. The polarity of the bias is reversed (with respect to the defect detection test), and the part is etched for 20 seconds at approximately 10 volts. The NaCl solution is less conductive, increasing the resistance of the system during the electrolysis reaction, and therefore requires a longer etching time. Etching time is also increased because aluminum metallization runs are generally several times thicker than nichrome devices, resulting in more aluminum to dissolve in the affected areas of the circuit.

Transistor device types have been tested using the method of the present invention, but these tests have proven to be time-consuming and rather difficult to perform. This is primarily due to the small size of these devices. Therefore, an alternative method of testing transistor devices using electrolysis is disclosed herein. This alternative method, like the method disclosed as prior art, is destructive to a device having defective glassivation, but does not involve hazardous chemicals, heat or setup time involved in that method.

Figure 6:
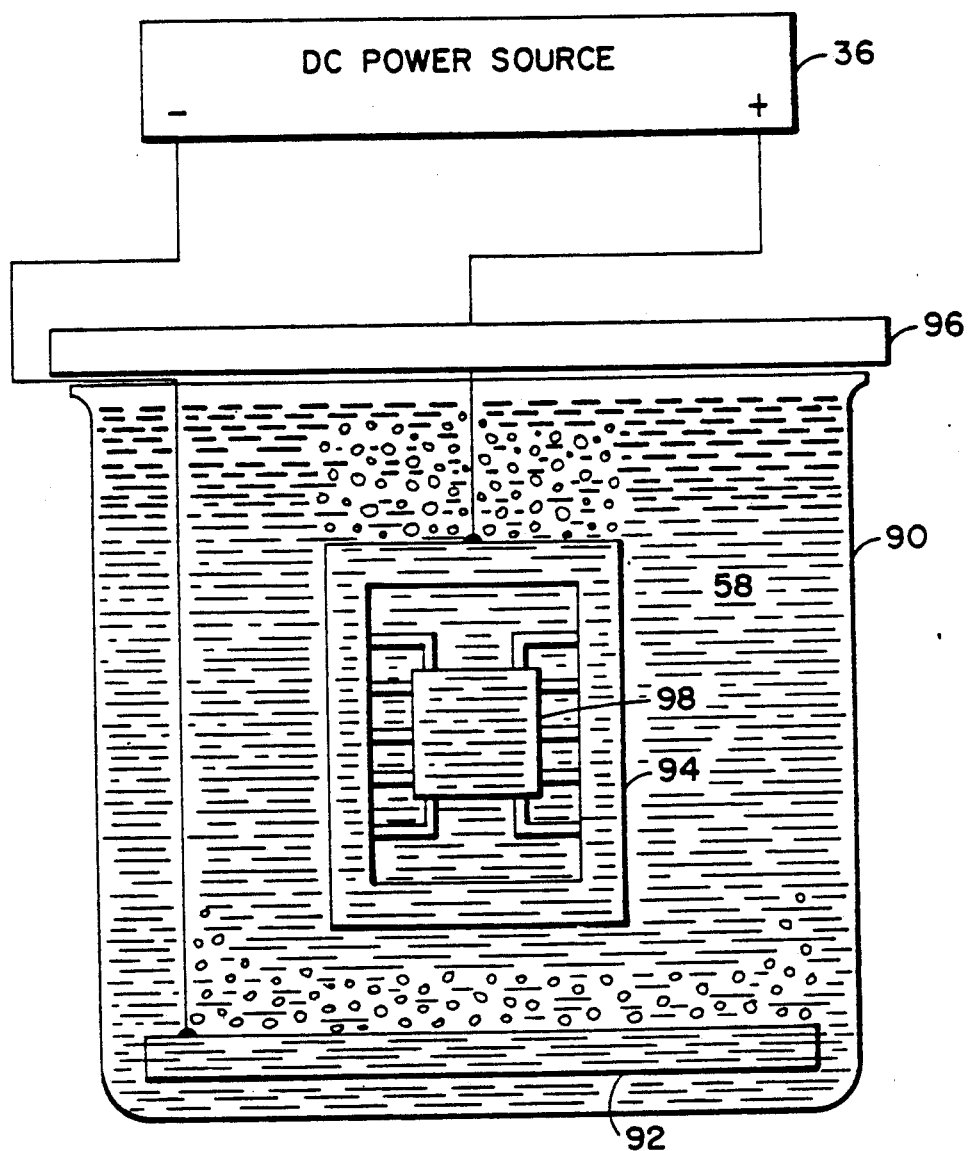
FIG. 6 illustrates a test setup used in a process for testing encapsulation integrity in a small transistor package.

The test setup for these small devices, illustrated in FIG. 6, involves the use of approximately 300 to 500 ml of the sodium chloride (NaCl) solution 58 in a container, illustratively beaker 90. A metal plate 92 is placed on the inside bottom surface of beaker 90 and is connected to the more negative side of power supply 36. An integrated circuit socket 94 in solution 58 is connected through a protective cover 96 to the more positive terminal of power supply 36. A transistor device 98 to be tested is placed into IC socket 94 and is lowered into solution 58. An electrical potential is applied for 10 to 15 seconds. Device 98 is then removed and inspected under a high-powered microscope for any etching that may have occurred; it may be photographed for documentation if any gross or fine anomalies are detected.

This test may also be used as an alternative to the methods disclosed in relation to FIGS. 4 and 5 for etching and documenting all types of integrated circuits. In this case, all parts that have been determined to have defective glassivation by the non-destructive method disclosed in relation to FIG. 3, may be put aside and, at a later time, etched for documentation in lots of several devices at one time.

By way of summary, the glassivation integrity test of the present invention provides many advantages over the method of the prior art. The new test is non-destructive and will test nichrome and aluminum circuitry at the same time, whereas the prior art method uses two separate destructive solutions. The new test is relatively inexpensive in comparison with test procedures which utilize costly acids which, in turn, generate additional storage and disposal expenses. The savings in time of the new test process over the prior art method are considerable. The new technique is more accurate in that it can easily detect limited diffusion reactions. In addition to capillary wicking, the new method has a wetting force generated by the high electrical force fields, which allow the solution to penetrate into very small pinholes or cracks. The new process is found to be far less hazardous by eliminating the concentrated chemicals. Finally, it uses a safe voltage and operates at room temperature.

While the principles of the present invention have been demonstrated with particular regard to the methods disclosed herein, it will be recognized that various departures from such disclosed methods may be undertaken in the practice of the invention. The scope of this invention is not intended to be limited to the methods disclosed herein but should instead by gauged by the breadth of the claims which follow.

What is claimed is:

1. A method for detecting voids in an insulating encapsulation layer overlying an electrical circuit including an electrically conductive region, said method comprising the steps of:
   a. covering said encapsulation layer with an electrolytic solution comprising deionized water;
   b. applying an electrical potential between said electrolytic solution and said electrically conductive region; and
   c. observing said encapsulation layer for the evolution of gas bubbles through said electrolytic solution.

2. The method according to claim 1 wherein said electrolytic solution comprises a weak solution of sulfuric acid in deionized water.

3. The method according to claim 2 wherein said applying step includes applying the more positive potential to said electrolytic solution.

4. The method according to claim 3 wherein said applying step includes applying an electrical potential substantially within the range of 5 to 7 volts.

5. The method according to claim 3 wherein said applying step includes applying an electrical potential for approximately 15 to 20 seconds.

6. The method according to claim 2 wherein said applying step includes applying the more negative potential to said electrolytic solution.

7. The method according to claim 6 wherein said applying step includes applying an electrical potential of approximately 10 volts.

8. The method according to claim 6 wherein said applying step includes applying an electrical potential for approximately 10 to 15 seconds.

9. The method according to claim 1 wherein said electrolytic solution comprises a weak solution of sodium chloride in deionized water.

10. The method according to claim 9 wherein said applying step includes applying the more negative potential to said electrolytic solution.

11. The method according claim 10 wherein said applying step includes applying an electrical potential of approximately 10 volts.

12. The method according to claim 10 wherein said applying step includes applying an electrical potential for approximately 20 seconds.

13. A method for detecting voids in an insulating encapsulation layer overlying an electrical circuit having an electrically conductive region, said method comprising the steps of:
   a. covering said encapsulation layer with an electrolytic solution comprising a weak solution of sulfuric acid in deionized water;
   b. applying a first electrical potential to said electrically conductive region and a second, more positive potential to said electrolytic solution; and
   c. observing said encapsulation layer for the evolution of hydrogen gas bubbles through said electrolytic solution.

14. A method for detecting voids in an insulating encapsulation layer overlying an electrical circuit having an electrically conductive region including nichrome, said method comprising the steps of:
   a. covering said encapsulation layer with an electrolytic solution comprising a weak solution of sulfuric acid in deionized water;
   b. applying a first electrical potential to said electrically conductive region and a second, more negative potential to said electrolytic solution; and
   c. observing said encapsulation layer for the evolution of oxygen gas bubbles through said electrolytic solution.

15. A method for detecting voids in an insulating encapsulation layer overlying an electrical circuit having an electrically conductive region including aluminum, said method comprising the steps of:
   a. covering said encapsulation layer with an electrolytic solution comprising a weak solution of sodium chloride in deionized water;
   b. applying a first electrical potential to said electrically conductive region and a second, more negative potential to said electrolytic solution; and
   c. observing said encapsulation layer for the evolution of oxygen gas bubbles through said electrolytic solution.

* * * * *